(12) United States Patent
Romero

(10) Patent No.: US 10,288,698 B2
(45) Date of Patent: May 14, 2019

(54) MAGNETIC FIELD SENSOR HAVING ALIGNMENT ERROR CORRECTION

(71) Applicant: Allegro MicroSystems, LLC, Manchester, NH (US)

(72) Inventor: Hernán D. Romero, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 298 days.

(21) Appl. No.: 15/180,199

(22) Filed: Jun. 13, 2016

(65) Prior Publication Data
US 2017/0356966 A1    Dec. 14, 2017

(51) Int. Cl.
| | | |
|---|---|---|
| G01R 33/00 | (2006.01) | |
| G01P 21/02 | (2006.01) | |
| G01R 33/06 | (2006.01) | |
| G01R 35/00 | (2006.01) | |

(52) U.S. Cl.
CPC .......... *G01R 33/0017* (2013.01); *G01P 21/02* (2013.01); *G01R 33/0029* (2013.01); *G01R 33/06* (2013.01); *G01R 35/005* (2013.01)

(58) Field of Classification Search
USPC ......................................................... 702/92
See application file for complete search history.

(56) References Cited

U.S. PATENT DOCUMENTS

| | | | | |
|---|---|---|---|---|
| 4,933,640 A | * | 6/1990 | Kuckes | E21B 47/02216 166/66.5 |
| 9,417,295 B2 | * | 8/2016 | Friedrich | G01R 33/0023 |
| 2002/0180428 A1 | * | 12/2002 | Weser | G01D 5/24461 324/207.25 |
| 2005/0283988 A1 | * | 12/2005 | Sato | G01C 17/38 33/356 |
| 2006/0089784 A1 | | 4/2006 | Spicer et al. | |

(Continued)

FOREIGN PATENT DOCUMENTS

| | | |
|---|---|---|
| IE | 2009/0465 | 12/2009 |
| JP | 2016-61708 A | 4/2016 |
| WO | WO 2015/156635 A1 | 10/2015 |

OTHER PUBLICATIONS

U.S. Appl. No. 15/181,889, filed Jun. 14, 2016, Romero.

(Continued)

*Primary Examiner* — Paul D Lee
(74) *Attorney, Agent, or Firm* — Daly, Crowley, Mofford & Durkee, LLP (57) ABSTRACT

A method of calibrating a magnetic field sensor includes setting a first input signal at a first input node of a processor of the magnetic field sensor to a constant value. While the magnetic field sensor experiences a magnetic field, a first transition at an output node of the processor is measured. A second input signal at a second input node of the processor is set to the constant value. While the magnetic field sensor experiences the magnetic field, a second transition of at the output node of the processor is measured. An orthogonality error value is calculated based on a deviation of the first transition and the second transition. The first and/or second input signal is adjusted by modifying the first and/or second input signal by a function of the calculated orthogonality error value to compensate for the orthogonality error.

22 Claims, 9 Drawing Sheets

(56) References Cited

U.S. PATENT DOCUMENTS

| | | | | |
|---|---|---|---|---|
| 2006/0290545 | A1* | 12/2006 | Granig | H03M 1/06 341/118 |
| 2009/0174395 | A1* | 7/2009 | Thomas | G01D 5/145 324/207.2 |
| 2011/0267041 | A1* | 11/2011 | Li | G01D 5/145 324/207.2 |
| 2013/0265037 | A1* | 10/2013 | Friedrich | G01R 33/07 324/207.2 |
| 2015/0022186 | A1* | 1/2015 | Ausserlechner | G01D 5/145 324/207.2 |
| 2018/0017418 | A1* | 1/2018 | Deak | G01B 7/30 |

OTHER PUBLICATIONS

U.S. Appl. No. 15/012,125, filed Feb. 1, 2016, Alpago, et al.
PCT International Search Report and Written Opinion dated Aug. 28, 2017 for International Application No. PCT/US2017/035702; 15 pages.

\* cited by examiner

MAGNETIC FIELD SENSOR HAVING ALIGNMENT ERROR CORRECTION

FIELD

This disclosure relates to magnetic field sensors and, more particularly, to calibration of and compensation for error in magnetic field sensors.

BACKGROUND

Magnetic field sensors often contain two or more magnetic field sensing elements. In order to detect a magnetic field properly, the magnetic field sensing elements may need to be aligned, not only with respect to the magnetic field that they sense, but also with respect to each other. If magnetic field sensing elements are individual components, they may be placed (e.g. on a printed circuit board) so that they are aligned. As another example, if the magnetic field sensing elements are formed on or as part of a semiconductor die, they may be formed on or as part of the semiconductor die so that they are aligned.

Variations in alignment, or an imperfect alignment of the magnetic field sensing elements can lead to errors in detecting the magnetic field. Variations in the alignment can introduce errors in the output signals of the magnetic field sensor, thus reducing sensitivity and/or accuracy of the sensor

SUMMARY

In an embodiment, a method of calibrating a magnetic field sensor includes setting a first input signal at a first input node of a CORDIC processor of the magnetic field sensor to a constant value. During the setting the first input signal, while the magnetic field sensor experiences a magnetic field angle variation, a first transition at an output node of the CORDIC processor is measured. A second input signal at a second input node of the CORDIC processor is set to the constant value. During the setting the second input signal, while the magnetic field sensor experiences the magnetic field angle variation, a second transition of at the output node of the CORDIC processor is measured. An orthogonality error value is calculated based on a deviation of the first transition and the second transition from respective expected transitions of the output signal of the CORDIC processor. The first and/or second input signal is adjusted by modifying the first and/or second input signal by a function of the calculated orthogonality error value to compensate for the orthogonality error.

In another embodiment, a method of calibrating a magnetic field sensor includes receiving, at a first input node of a CORDIC processor, a first signal from a first magnetic field sensing element. While receiving the first signal at the first input node, at a second input node of the CORDIC processor, a reference signal set to a constant value is received. At the first input node of the CORDIC processor, the reference signal is set to the constant value. While receiving the reference signal at the first input node, at the second input node of the CORDIC processor, a second signal from a second magnetic field sensing element is received. A difference between a transition of an output of the CORDIC processor and an expected transition of the output of the CORDIC processor in response to the first, second, and reference signals is measured. An output of the first and/or second magnetic field sensing element is modified by a function of the measured difference to compensate for an orthogonality error of the first and/or second magnetic field sensing element. An axis of maximum sensitivity of the first magnetic field sensing element is substantially orthogonal to an axis of maximum sensitivity of the second magnetic field sensing elements so that the first signal from the first magnetic field sensing element and the second signal from the second magnetic field sensing element are quadrature signals.

In another embodiment, a magnetic field sensor includes a first magnetic field sensing element for generating a first input signal and having a first axis of maximum sensitivity; a second magnetic field sensing element for generating a second input signal and having a second axis of maximum sensitivity; a CORDIC processor coupled to receive the first input signal and the second input signal, and configured to generate an output signal representing a detected angle of a magnetic field; and a compensation circuit coupled to receive the first or second input signal from the first or second magnetic field sensing element and operable to modify the first or second input signal using a compensation signal.

The compensation signal may be derived by: setting the first input signal to a constant value and measuring a first difference between a first transition of the output signal of the CORDIC processor and a first expected transition of the output signal of the CORDIC processor; and setting the second input signal to the constant value and measuring a second difference between a second transition of the output of the CORDIC processor and a second expected output signal of the CORDIC processor.

BRIEF DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more exemplary embodiments. Accordingly, the figures are not intended to limit the scope of the invention. Like numbers in the figures denote like elements.

Like reference numbers in the drawings denote like elements.

DETAILED DESCRIPTION

As used herein, the term "magnetic field sensing element" is used to describe a variety of electronic elements that can sense a magnetic field. The magnetic field sensing element can be, but is not limited to, a Hall Effect element, a magnetoresistance element, or a magnetotransistor. As is known, there are different types of Hall Effect elements, for example, a planar Hall element, a vertical Hall element, and a Circular Vertical Hall (CVH) element. As is also known, there are different types of magnetoresistance elements, for example, a semiconductor magnetoresistance element such as Indium Antimonide (InSb), a giant magnetoresistance (GMR) element, an anisotropic magnetoresistance element (AMR), a tunneling magnetoresistance (TMR) element, and a magnetic tunnel junction (MTJ). The magnetic field sensing element may be a single element or, alternatively, may include two or more magnetic field sensing elements arranged in various configurations, e.g., a half bridge or full (Wheatstone) bridge. Depending on the device type and other application requirements, the magnetic field sensing element may be a device made of a type IV semiconductor material such as Silicon (Si) or Germanium (Ge), or a type III-V semiconductor material like Gallium-Arsenide (GaAs) or an Indium compound, e.g., Indium-Antimonide (InSb).

As is known, some of the above-described magnetic field sensing elements tend to have an axis of maximum sensitivity parallel to a substrate that supports the magnetic field sensing element, and others of the above-described magnetic field sensing elements tend to have an axis of maximum sensitivity perpendicular to a substrate that supports the magnetic field sensing element. In particular, planar Hall elements tend to have axes of sensitivity perpendicular to a substrate, while metal based or metallic magnetoresistance elements (e.g., GMR, TMR, AMR) and vertical Hall elements tend to have axes of sensitivity parallel to a substrate.

As used herein, the term "magnetic field sensor" is used to describe a circuit that uses a magnetic field sensing element, generally in combination with other circuits. Magnetic field sensors are used in a variety of applications, including, but not limited to, an angle sensor that senses an angle of a direction of a magnetic field, a current sensor that senses a magnetic field generated by a current carried by a current-carrying conductor, a magnetic switch that senses the proximity of a ferromagnetic object, a rotation detector that senses passing ferromagnetic articles, for example, magnetic domains of a ring magnet or a ferromagnetic target (e.g., gear teeth) where the magnetic field sensor is used in combination with a back-biased or other magnet, and a magnetic field sensor that senses a magnetic field density of a magnetic field.

As used herein, the terms "target" and "magnetic target" are used to describe an object to be sensed or detected by a magnetic field sensor or magnetic field sensing element.

Figure 1:
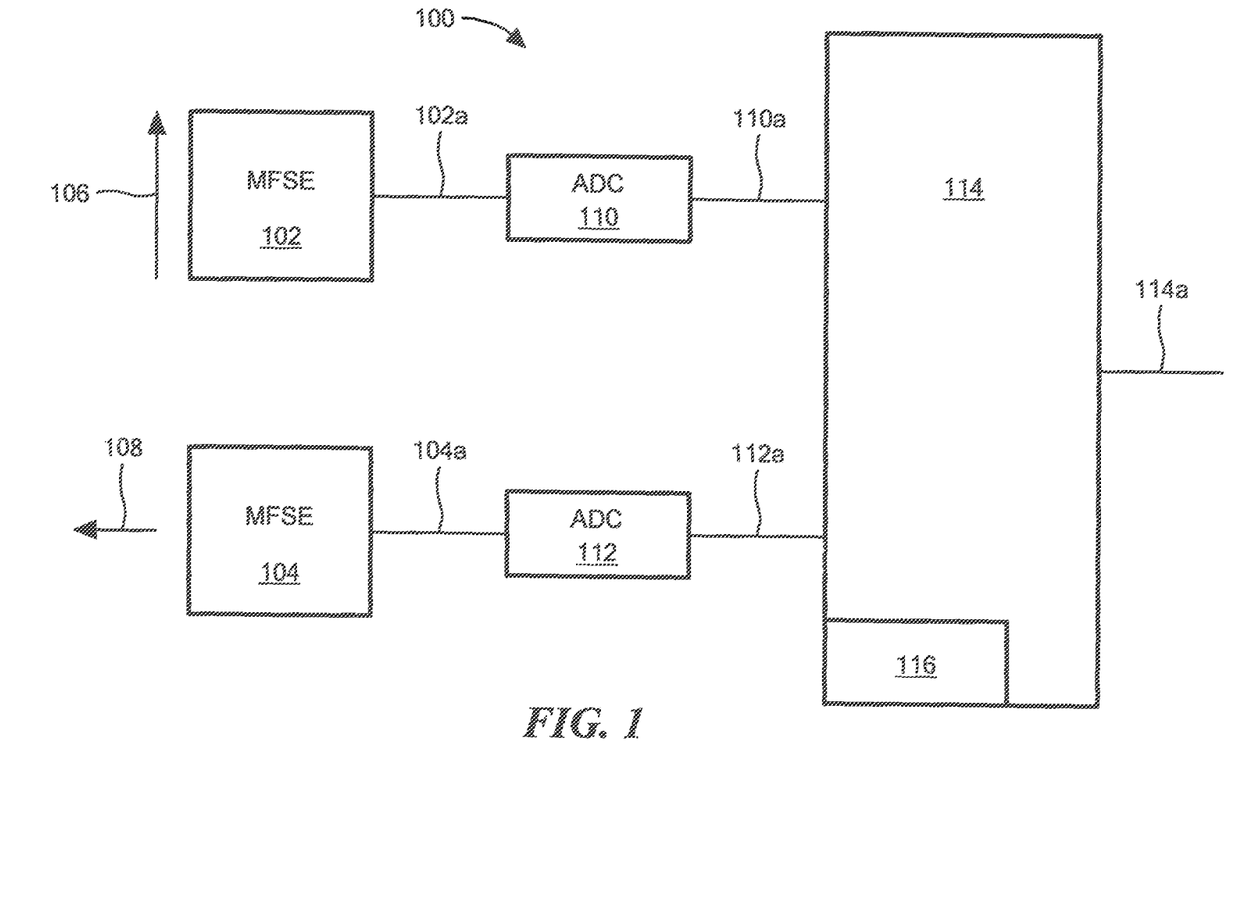
FIG. 1 is a block diagram of a magnetic field sensor for measuring a magnetic field.

FIG. 1 is a block diagram of a magnetic field sensor 100 for detecting a magnetic field. In an embodiment, the magnetic field may be a rotating magnetic field and magnetic field sensor 100 may be configured to detect an angle of rotation of the magnetic field. However, in another embodiment, the magnetic field may be a generally static magnetic field and magnetic field sensor 100 may be configured to detect an angle of the static magnetic field.

Magnetic field sensor 100 may include a first magnetic field sensing element 102 and a second magnetic field sensing element 104. In embodiments, first and second magnetic field sensing elements 102 and 104 may comprise vertical Hall elements, magnetoresistance elements, or both. In one example, one or more of magnetic field sensing elements 102 and 104 may comprise a magnetoresistance bridge.

First magnetic field sensing element 102 and second magnetic field sensing element 104 may be positioned so an axis of maximum sensitivity of the first magnetic field sensing element 102 is orthogonal to an axis of maximum sensitivity of the second magnetic field sensing element 104. For example, if the axis of maximum sensitivity of first magnetic field sensing element 102 is aligned with arrow 106, then the axis of maximum sensitivity of magnetic field sensing element 104 may be aligned with arrow 108, which is drawn at a relative direction ninety degrees from that of arrow 106. One skilled in the art will recognize that other directions of alignment may be used so that the axes of maximum sensitivity of magnetic field sensing elements 102 and 104 are orthogonal.

In an embodiment, magnetic field sensing elements 102 and 104 may detect a pointing direction of a rotating (or static) magnetic field. In some figures below, it is assumed that the magnetic field is rotating. Signal 102a and 104a may be signals produced by first and second magnetic field sensing elements 102 and 104, respectively. Signals 102a and 104a may represent the strength of an external magnetic field as sensed by first and second magnetic field sensing elements 102 and 104. If first and second magnetic field sensing elements 102 and 104 are detecting the same external magnetic field, signals 102a and 104a may be quadrature signals, i.e. ninety degrees out of phase with each other. In an embodiment, this is due to the axes of maximum sensitivity of magnetic field sensing elements 102 and 108 having orthogonal alignment to each other.

Analog-to-digital converters (ADC) 110 and 112 may receive signals 102a and 104a and convert them to digital signals 110a and 112a, respectively. Digital signals 110a and 112a may also be quadrature signals.

Magnetic field sensor 100 may also include a processor 114. In an embodiment, processor 114 may be a coordinate rotation digital computer (CORDIC) processor that can perform hyperbolic and/or trigonometric functions. In an embodiment, processor 114 may perform an arctangent function on received signals 110a and 112a, and produce an output signal 114a that represents an angle of the magnetic field detected by magnetic field sensing elements 102 and 104. Processor 114 may also perform other signal processing functions to produce information about the detected magnetic field.

In an embodiment, processor 114 is a dedicated or custom circuit designed to perform signal processing. For example, if processor 114 performs an arctangent function, then processor 114 may be a circuit or processor designed specifically to perform that particular function. In other embodiments, processor 114 may be a general-purpose processor or a signal processor configured to perform signal processing functions. For example, processor 114 may comprise a memory 116 that stores software instructions, which, when executed by processor 114, cause processor 114 to perform its signal processing functions.

The memory 116 may comprise volatile memory, non-volatile memory, or both. Memory 116 may be configured to store software instructions (such as machine instructions, interpretable instructions such as scripts, and/or compiled instructions from firmware or software, etc.) and or data.

In an embodiment, first and second magnetic field sensing elements 102 and 104 may be physically aligned during manufacturing. If magnetic field sensing elements 102 and 104 are individual components, they may be placed (e.g. on a printed circuit board) so that their respective axes of maximum sensitivity are orthogonal. As another example, if magnetic field sensing elements 102 and 104 are formed on or as part of a common semiconductor die, they may be formed on or as part of the semiconductor die such that the axes of maximum sensitivity are orthogonal.

In certain cases, the first and second magnetic field sensing elements 102, 104 may be annealed after they are formed upon a semiconductor die. For example, if the first and second magnetic field sensing elements 102, 104 are magnetoresistance elements, pinned layers within the first and second magnetic field sensing element 102, 104 may be annealed to be orthogonal to each other after the magnetoresistance element is formed on or as part of the semiconductor die. Annealing will be understood to be a process in which magnetoresistance elements, at a late stage of manufacture, are placed under one or more conditions of respective predetermined temperature and respective predetermined magnetic field for a respective predetermined amount of time in order to set a direction of magnetic fields internal to the magnetoresistance elements. But, regardless of how the magnetic field sensing elements are formed or aligned, there may exist the possibility, due to manufacturing tolerances or error, that the axes of maximum sensitivity of magnetic field sensing elements 102 and 104 may not be perfectly orthogonal. In this situation, variations in the alignment of the axes of maximum sensitivity can produce a so-called orthogonality error.

Figure 2:
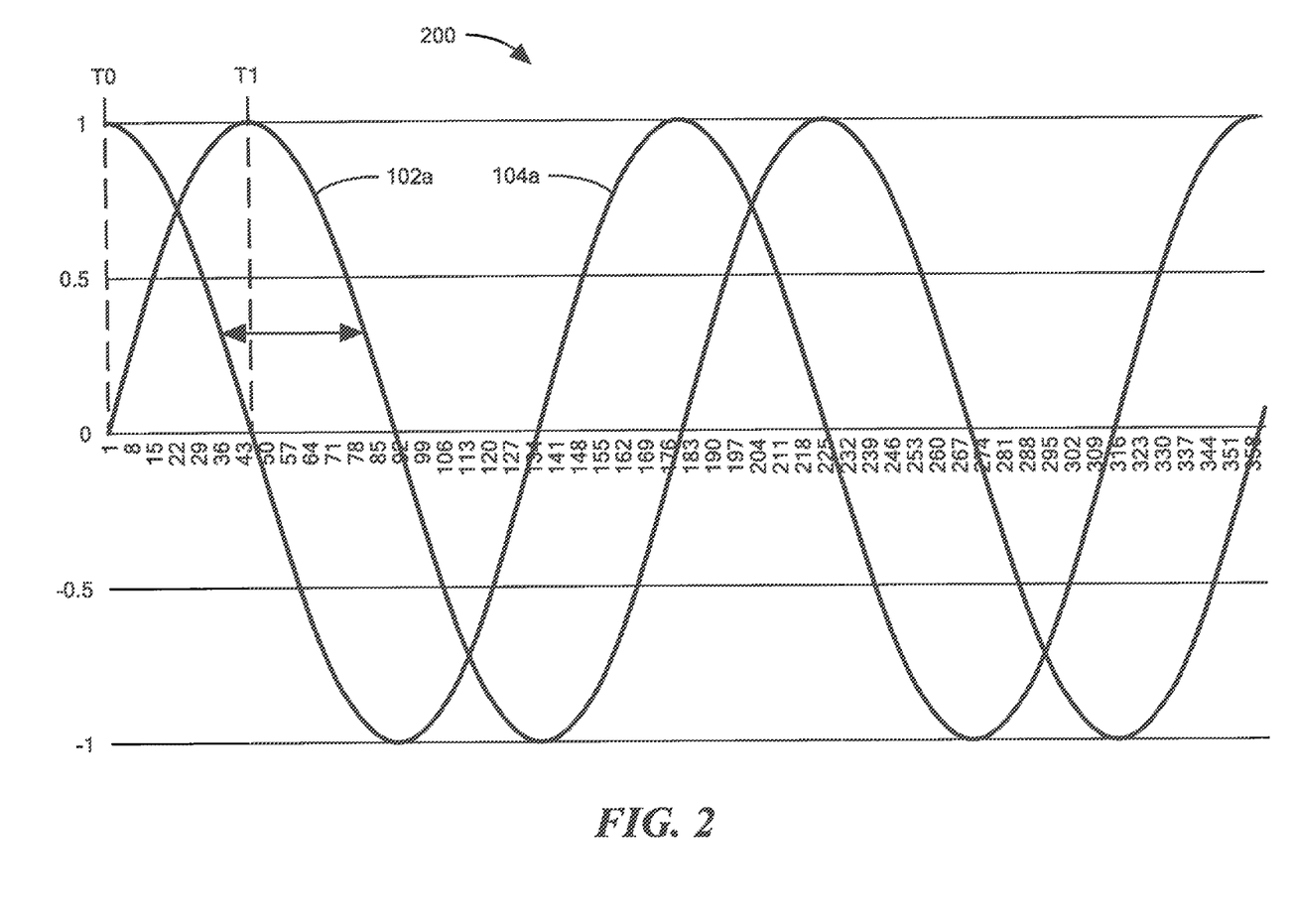
FIG. 2 is a graph of signals associated with FIG. 1.

Turning now to FIG. 2, graph 200 includes a horizontal axis representing the angle of the magnetic field detected by first and second magnetic field sensing elements 102 and 104, and a vertical axis representing the strength of the magnetic field as detected by first and second magnetic field sensing elements 102 and 104. Signal 102a (the signal produced by first magnetic field sensing element 102) is shown as a sine wave and signal 104a (the signal produced by second magnetic field sensing element 104) is shown as a cosine wave. At point TO, the external magnetic field has a direction aligned with arrow 108, so the value of signal 104a is high and the value of signal 102a is zero. At point Ti, the external magnetic field has rotated so it has a direction aligned with arrow 106, so the value of signal 102a is high and the value of signal 104a is zero. If there are errors in the alignment of magnetic field sensing elements 102 and/or 104, signals 102a and 104a may not have a phase difference of exactly ninety degrees. In this situation, the misalignment may produce errors in the detected angle of the external magnetic field.

It will be appreciated that, for the first and second magnetic field sensing elements 102, 104 of FIG. 1 that are perfectly aligned to have maximum response axes that at ninety degrees apart, a pointing direction of a magnetic field can be determined merely my calculating an arctangent of a ratio of the two signals 104a, 102b.

Figure 3:
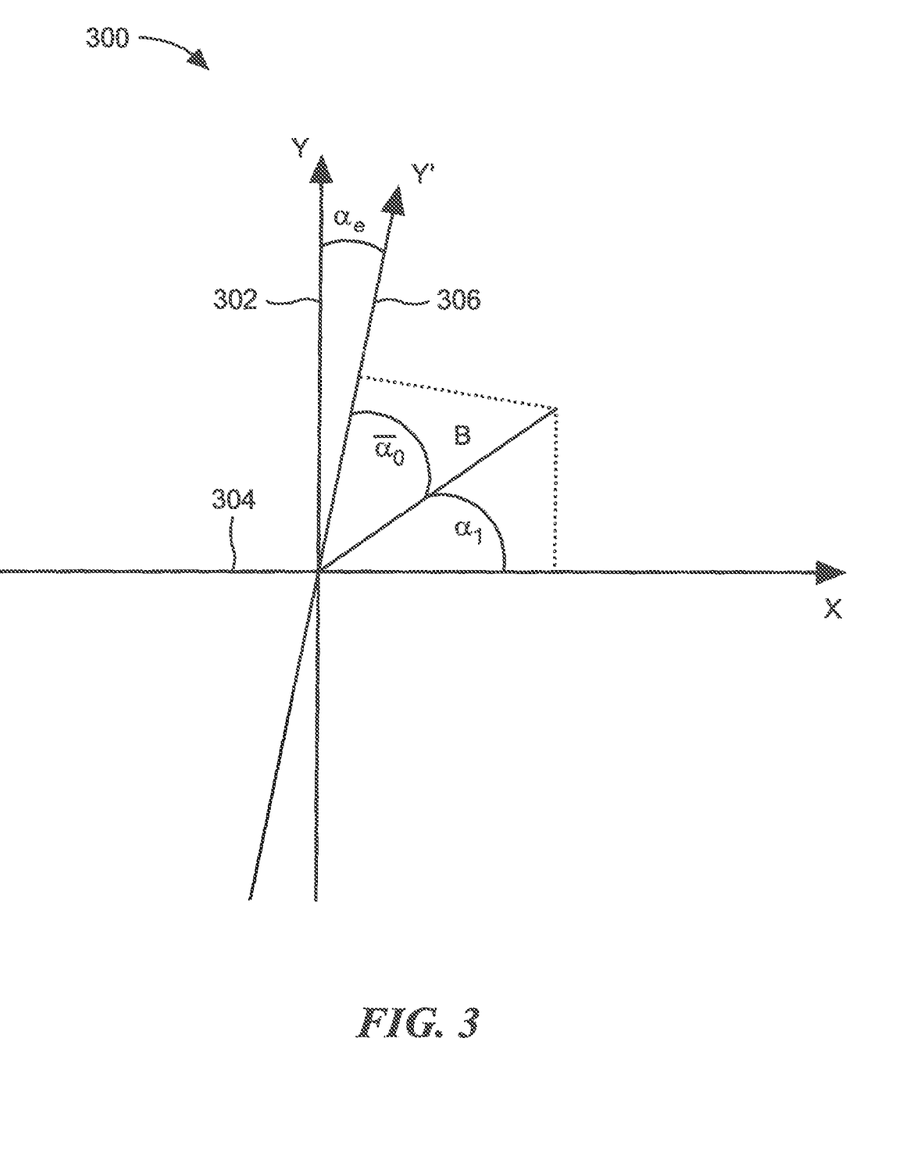
FIG. 3 is a graph of an error associated with signals of FIG. 2.

FIG. 3 is a graph 300 showing an example of misalignment of a magnetic field sensing element. If the magnetic field sensing elements were aligned orthogonally, the axes of maximum sensitivity would correspond to the horizontal axis 304 and vertical axis 302 of graph 300. In this example, one of the axes of maximum sensitivity is shifted from the vertical axis 302 by an error of $\alpha_e$, as shown by line 306. Thus, the phase between signals 102a and 104a of FIG. 2 may not be ninety degrees and the resulting calculation of the angle of the detected magnetic field may contain an orthogonality error.

Figure 4:
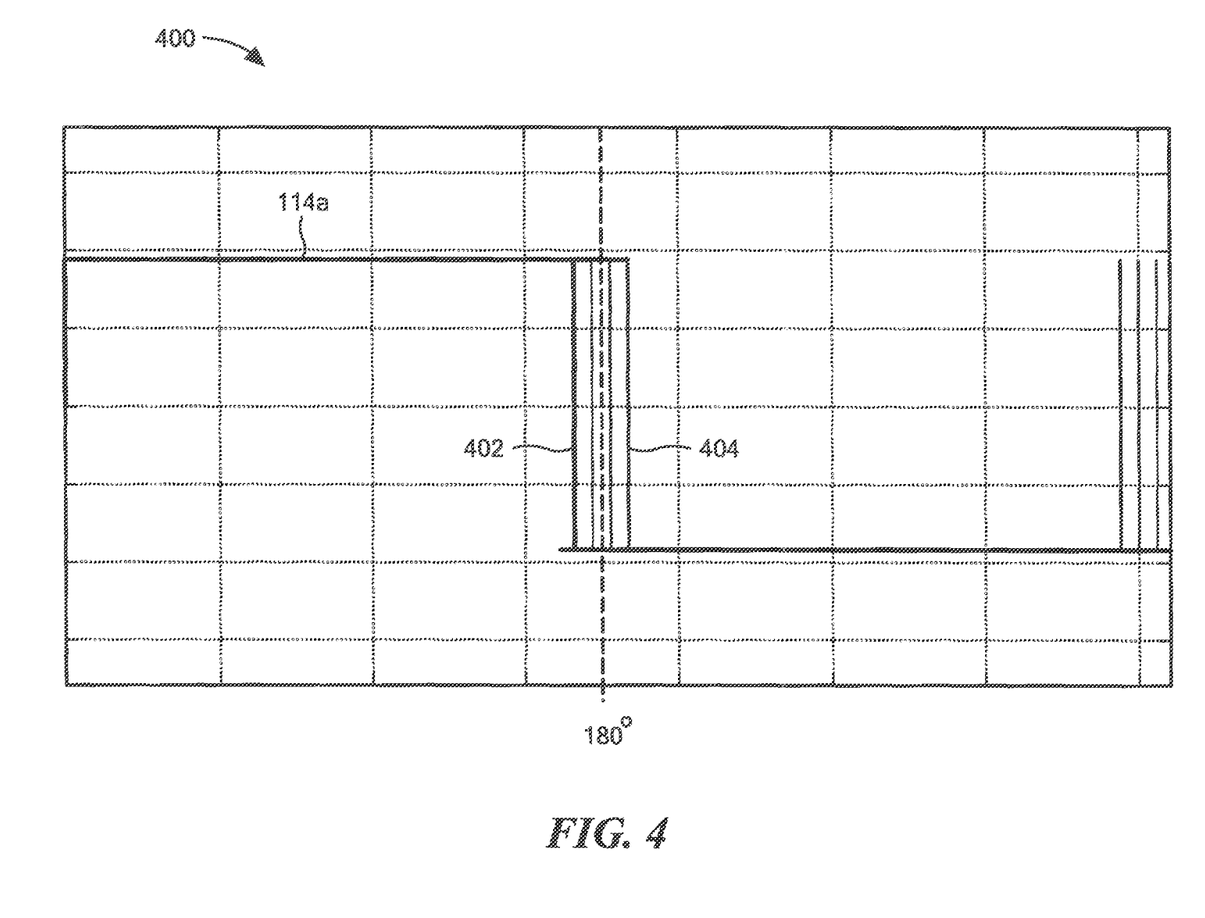
FIG. 4 is a graph of a first output signal of the magnetic field sensor of FIG. 1 during a calibration process.

FIG. 4 is a graph 400 of output signal 114a of processor 114 during a calibration procedure. The horizontal axis refers to the angle of a reference magnetic field that may be used to calibrate magnetic field sensor 100. The vertical axis has a scale in units of volts in arbitrary units.

To compensate for the orthogonality error, a constant value may be provided to one of the inputs of processor 114. For example, signal 102a and/or 110a may be replaced by a constant value while second magnetic field sensing element 104 detects the reference magnetic field. The reference magnetic field may be a rotating magnetic field having a known angle of rotation so that, when detected by magnetic field sensor 100, processor 114 can produce an output signal that deviates from an expected output signal. In an embodiment, the reference magnetic field may be produced by manufacturing test equipment during calibration of magnetic field sensor 100.

As the reference magnetic field rotates, it is desired that the output signal 114a of processor 114 transitions at an expected value of magnetic field pointing direction, as shown in FIG. 4. In the example shown, if magnetic field sensor 104 is properly aligned, the expected transition of signal 114a may occur when the reference magnetic field has a direction of one hundred eighty degrees. However, if magnetic field sensing element 104 is not properly aligned, the transition of signal 114a may occur before or after the one hundred eighty degree mark, as shown by transitions 402 and 404, respectively. The difference between the actual transition and the expected transition at one hundred eighty degrees may be used to calculate an orthogonality error value during calibration.

Figure 5:
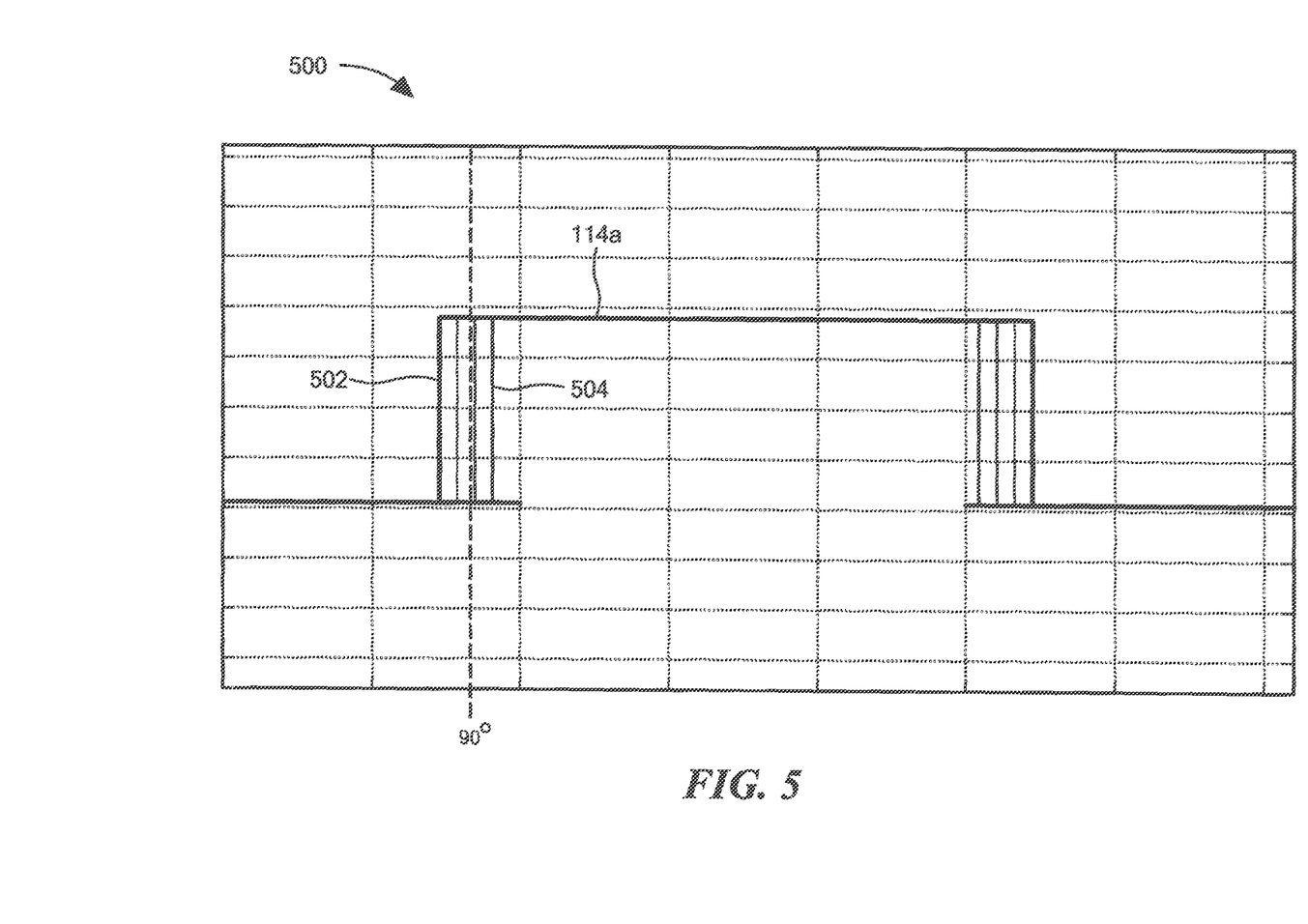
FIG. 5 is a graph of a second output signal of the magnetic field sensor of FIG. 1 during a calibration process.

FIG. 5 is a graph 500 of output signal 114a of processor 114 during another step of a calibration procedure. The horizontal axis refers to the angle of a reference magnetic field that may be used to calibrate magnetic field sensor 100. The vertical axis has a scale in units of volts in arbitrary units.

In the example shown in FIG. 5, signal 104a and/or 112a may be replaced by a constant value while first magnetic field sensing element 102 detects the reference magnetic field.

As the reference magnetic field rotates, it is desired that the output signal 114a of processor 114 transitions at an expected value of magnetic field pointing direction, as shown in FIG. 5. In the example shown, if magnetic field sensor 102 is properly aligned, the transition of signal 114a may occur when the reference magnetic field has a direction of ninety degrees. However, if magnetic field sensing element 102 is not properly aligned, the transition of signal 114a may occur before or after the ninety-degree mark, as shown by transitions 502 and 504, respectively. The difference between the actual transition and the expected transition at ninety degrees may be used to calculate an orthogonality error value during calibration.

The first and/or second input signal may be adjusted by modifying one of or both of the signals 102a, 104a by a function of the calculated orthogonality error value to compensate for the orthogonality error.

To produce the transitions in FIG. 4 and FIG. 5, the constant value applied to the input of processor 114 may be a zero-voltage value. This may produce the square wave transitions shown in FIG. 4 and FIG. 5. In other embodiments, the constant value may be a non-zero value. Providing a non-zero value may affect the transition of output signal 114a during calibration.

Figure 6:
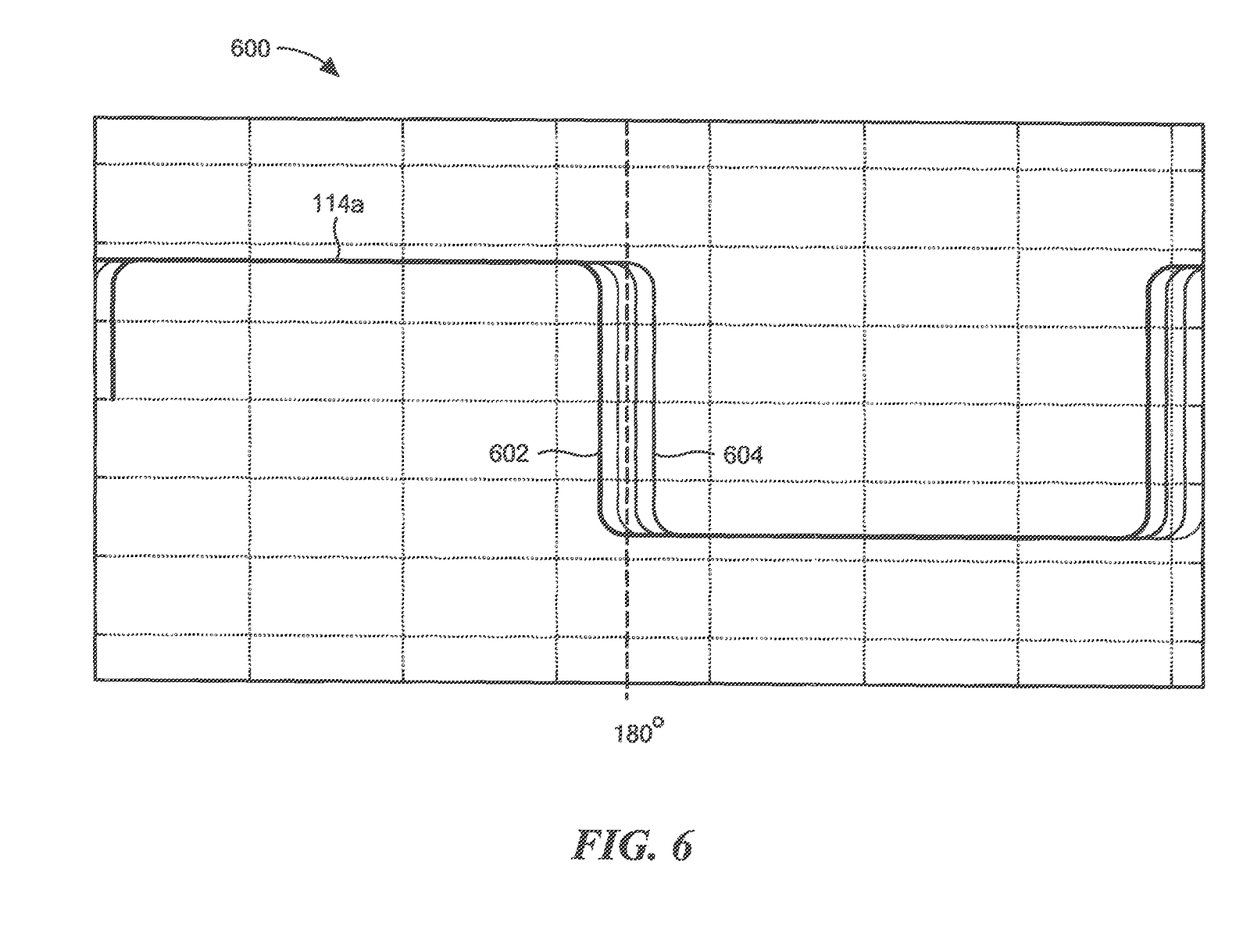
FIG. 6 is a graph of an alternative first output signal of the magnetic field sensor of FIG. 1 during a calibration process.
Figure 7:
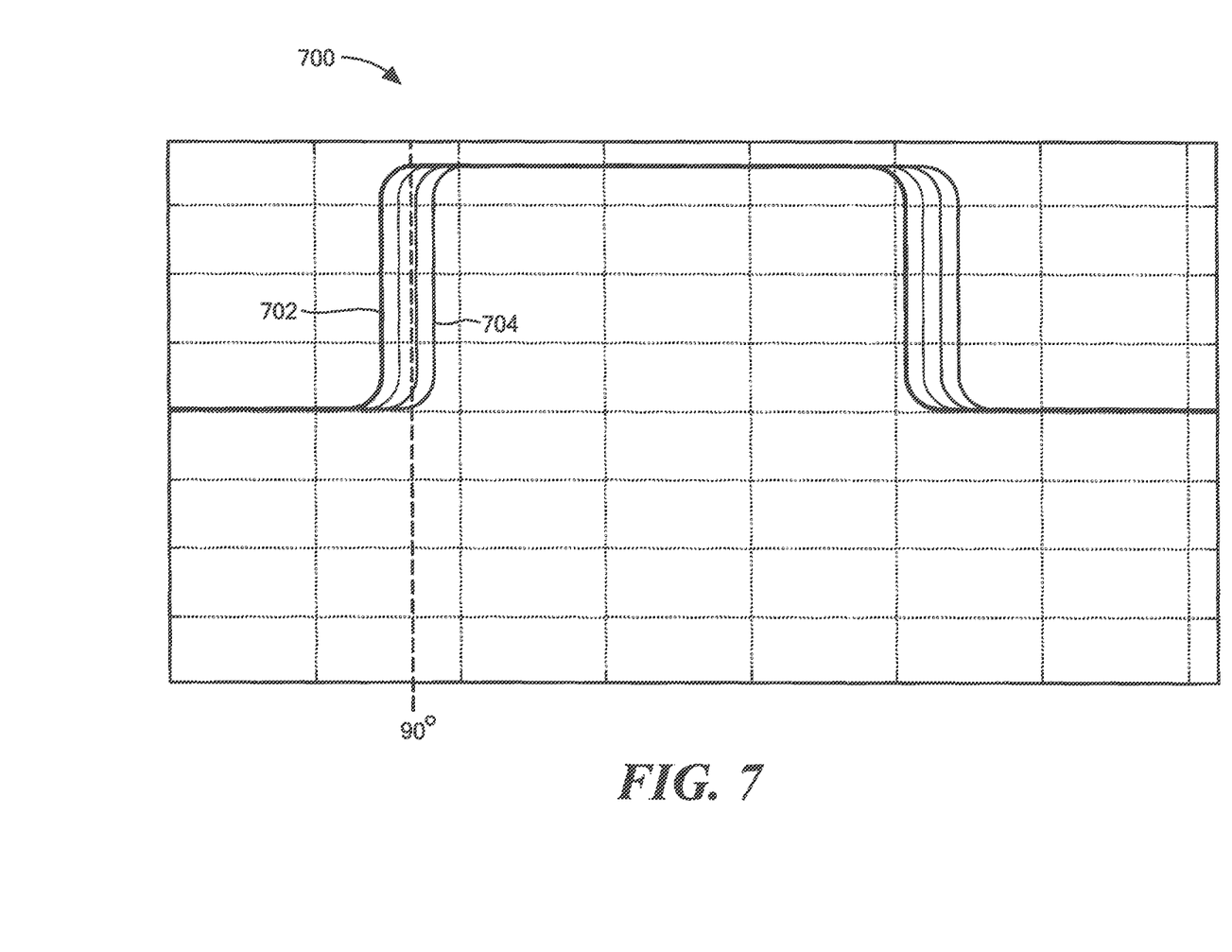
FIG. 7 is a graph of and alternative second output signal of the magnetic field sensor of FIG. 1 during a calibration process.

Referring to FIG. 6 and FIG. 7, a non-zero constant value may be provided to produce a more gradual transition in signal 114a. A more gradual transition may be beneficial for extrapolating (or interpolating) information from the curve. For example, a more gradual transition can assist in calculating zero crossings or threshold crossings of the curve to determine accurately where the transition occurs.

FIG. 6 is a graph 600 of output signal 114a of processor 114 during a calibration procedure. The horizontal axis refers to the angle of a reference magnetic field that may be used to calibrate magnetic field sensor 100. The vertical axis has a scale in units of volts in arbitrary units.

In this example, a constant, non-zero value may be provided to one of the inputs of processor 114. For example, signal 102a and/or 110a may be replaced by a constant non-zero value while magnetic field sensing element 104 detects the reference magnetic field. The reference magnetic field may be a rotating magnetic field having a known angle of rotation so that, when detected by magnetic field sensor 100, processor 114 can produce an expected output. Deviations from the expected output signal may be used to calibrate the magnetic field sensor. In an embodiment, the reference magnetic field may be produced by manufacturing test equipment during calibration of magnetic field sensor 100.

As the reference magnetic field rotates, the output signal 114a of processor 114 will transition at an expected value, as shown in FIG. 6. In the example shown, if magnetic field sensor 104 is properly aligned, the transition of signal 114a may occur when the reference magnetic field has a direction of one hundred eighty degrees. However, if magnetic field sensing element 104 is not properly aligned, the transition of signal 114a may occur before or after the one hundred eighty-degree mark, as shown by transitions 602 and 604, respectively. The difference between the actual transition and the expected transition at one hundred eighty degrees may be used for calibration.

FIG. 7 is a graph 700 of output signal 114a of processor 114 during another step of a calibration procedure. The horizontal axis refers to the angle of a reference magnetic field that may be used to calibrate magnetic field sensor 100. The vertical axis has a scale in units of volts in arbitrary units.

In the example shown in FIG. 7, signal 104a and/or 112a may be replaced by a constant, non-zero value while magnetic field sensing element 102 detects the reference magnetic field.

As the reference magnetic field rotates, the output signal 114a of processor 114 will transition at an expected value, as shown in FIG. 5. In the example shown, if magnetic field sensor 102 is properly aligned, the transition of signal 114a may occur when the reference magnetic field has a direction of ninety degrees. However, if magnetic field sensing element 102 is not properly aligned, the transition of signal 114a may occur before or after the ninety-degree mark, as shown by transitions 702 and 704, respectively. The difference between the actual transition and the expected transition at ninety degrees may be used for calibration.

Figure 8:
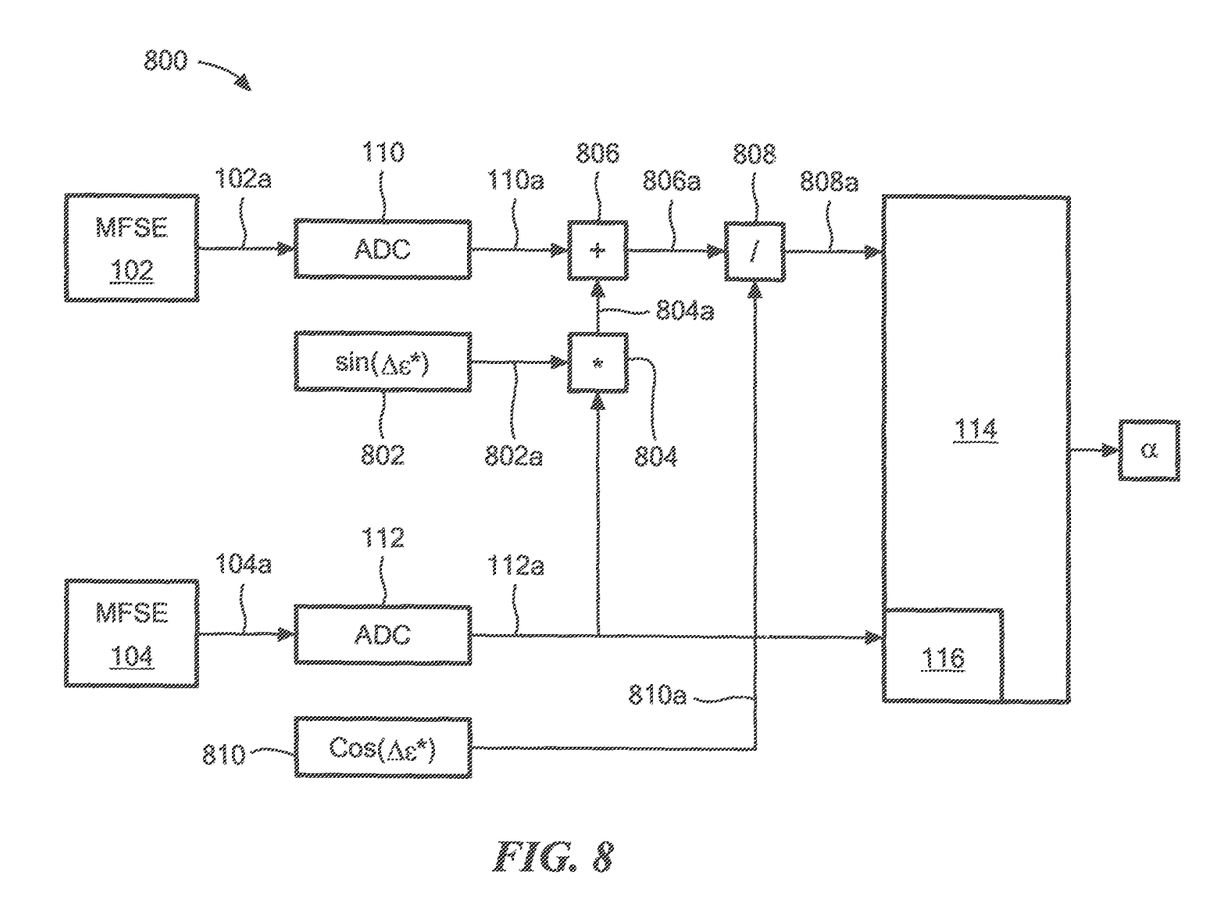
FIG. 8 is a block diagram of another magnetic field sensor for measuring a magnetic field including a compensation circuit.

Referring to FIG. 8, a magnetic field sensor 800 for detecting a magnetic field may be the same as or similar to magnetic field sensor 100. Magnetic field sensor 800 includes the first and second magnetic field sensing elements 102 and 104, the ADCs 110 and 112, and processor 114. Magnetic field sensor 800 also includes a compensation circuit or circuits configured to adjust the signals 110a and 112a to compensate for any orthogonality error. The compensation circuit may include any one or more of elements 802-812 in FIG. 8. Processor 114 may also be considered part of the compensation circuit. Of course, the compensation circuit shown in FIG. 8 is only an example. Any circuit (or software) or equivalent that adjusts the signals of magnetic field sensor 800 to compensate for an error may be considered a compensation circuit. In an embodiment, the compensation circuit may adjust the signals according to the following formula:

$$\frac{\cos(\alpha + \Delta\varepsilon) + \sin(\alpha)\sin(\Delta\varepsilon)}{\cos(\Delta\varepsilon)} = \cos(\alpha) \quad \text{Equation 1}$$

In Equation 1, $\alpha$ is the angle of the external magnetic field and $\Delta\varepsilon$ is the orthogonality error. In an embodiment, $\Delta\varepsilon$ is the difference of the difference between the first actual transition and the first expected transition, and the difference between the second actual transition and the second expected transition. For example, if the first actual transition occurs at eighty-nine degrees and the first expected transition is ninety degrees, and the second actual transition occurs at one hundred eighty one degrees and the second expected transition is one hundred eighty degrees, then $\Delta\varepsilon$ may be two degrees (i.e. (90 degrees–89 degrees)+(181 degrees–180 degrees)=2 degrees).

Also in Equation 1, and referring again to FIG. 8, signal 110a may be represented by the term $\cos(\alpha+\Delta\varepsilon)$ and signal 112a may be represented by the term $\sin(\alpha)$.

Magnetic field sensor 800 may include a compensation circuit as signal processing elements 802-810 which may modify signals 110a and 112a to compensate for the orthogonality error. Element 802 may be a constant value element 802 (e.g., a register to store a value), which may be an element that provides a constant value of $\sin(\Delta\varepsilon')$ as signal (or value) 802a, where $\Delta\varepsilon'$ is the orthogonality error as computed in the process described above. Element 810 may be an element (e.g., a register to store another value) that provides a constant value of $\cos(\Delta\varepsilon')$ as signal (or value) 810a. Once the orthogonality error $\Delta\varepsilon'$ has been computed (e.g., by external equipment), elements 802 and 810 may be configured or programmed to provide the respective constant values. This can take place, for example, during manufacturing and calibration of the magnetic field sensor.

Element 804 may be a multiplier element that multiplies signal 112a and signal 802a to produce signal (or value) 804a. Element 806 may be a summation element that adds signal 110a and signal (or value) 804a to produce signal 806a. Element 808 may be a division element that divides signal 806a by signal (or value) 810a to produce signal 808a. Elements 802-810 are elements that multiply, divide, and add input signals to produce a signal 808a that represents Equation 1 above. In an embodiment, any of elements 802-810 may be circuits that perform signal processing functions. In another embodiment, any of elements 802-810 may be software functions executed by a processor or signal processor (not shown). In another embodiment, any of elements 802-810 may be software functions executed by processor 114. In other embodiments, elements 802-810 may be other types of elements that execute signal processing functions.

Figure 9:
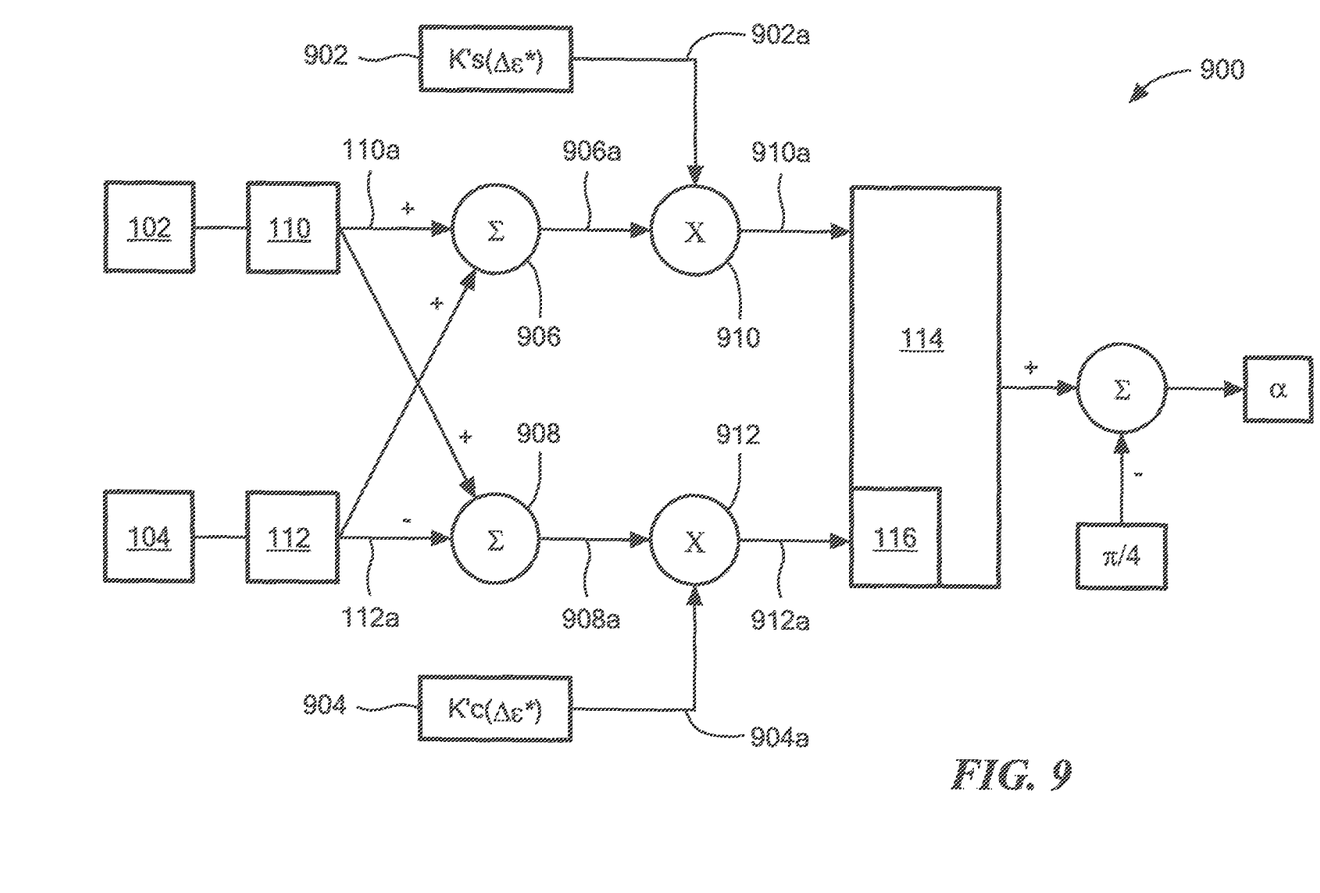
FIG. 9 is a block diagram of yet another magnetic field sensor for measuring a magnetic field including a compensation circuit.

Turning to FIG. 9, magnetic field sensor 900 may be the same as or similar to magnetic field sensor 100. Magnetic field sensor 900 includes the first and second magnetic field sensing elements 102 and 104, the ADCs 110 and 112, and processor 114. Magnetic field sensor 900 also includes a compensation circuit or circuits configured to adjust the signals 110a and 112a to compensate for any orthogonality error. The compensation circuit may include any one or more of elements 902-912 in FIG. 9. Processor 114 may also be considered part of the compensation circuit. Of course, the compensation circuit shown in FIG. 9 is only an example. Any circuit (or software) or equivalent that adjusts the signals of magnetic field sensor 800 to compensate for an error may be considered a compensation circuit. In an embodiment, the compensation circuit may adjust the signals according to the following formulas:

$$Q = 2K'_c K'_s \sin\left(\alpha + \frac{\pi}{4}\right) \quad \text{Equation 2}$$

$$I = 2K'_c K'_s \cos\left(\alpha + \frac{\pi}{4}\right) \quad \text{Equation 3}$$

Where:

$$K'_c = \cos\left(\frac{\Delta\epsilon'}{2} + \frac{\pi}{4}\right) \quad \text{Equation 4}$$

$$K'_s = \sin\left(\frac{\Delta\epsilon'}{2} + \frac{\pi}{4}\right) \quad \text{Equation 5}$$

In Equations 2-5, Q may represent signal 912a and I may represent signal 910a.

Magnetic field sensor 900 may include signal processing elements 902-912 which may modify signals 110a and 112a to compensate for the orthogonality error. Element 902 may be an element (e.g., a register to store a value) that provides a constant value of K's as signal (or value) 902a. Element 904 may be an element (e.g., another register to store another value) that provides a constant value of K's as signal (or value) 904a. Once the orthogonality error $\Delta\epsilon'$ has been computed, elements 902 and 904 may be configured or programmed to provide the respective constant values. This can take place, for example, during manufacturing and calibration of the magnetic field sensor.

Element 906 and 908 may be summation elements that sums signals 110a and 112a to produce signals 906a and 908a, respectively. In an embodiment, elements 906 and 908 may be substituted with a single summation element. Element 910 may be a multiplier element that multiplies signal 906a and signal (or value) 902a to produce signal 910a as an input to processor 114. Element 912 may be a multiplier element that multiplies signal 908a and signal (or value) 904a to produce signal 912a as another input to processor 114. In an embodiment, any of elements 902-912 may be circuits that perform signal processing functions. In another embodiment, any of elements 902-912 may be software functions executed by a processor or signal processor (not shown). In another embodiment, any of elements 902-912 may be software functions executed by processor 114. In other embodiments, elements 902-912 may be other types of elements that execute signal processing functions.

In an embodiment, an average of the transitions of signal 114a can be computed. The average may indicate if a calibration of the magnetic field sensor is correctly applied. For example, the average of the transition of signal 114a in FIG. 6 and FIG. 7 can be calculated and used to determine whether the magnetic field sensor has been calibrated correctly. If the average of the difference between the first transition and the expected transition, and the difference between the second transition and the expected transition is zero after the compensation circuit has been programmed to correct any orthogonality error, then the calibration has been performed correctly. For example, if the first transition occurs at 89 degrees and the expected transition is 90 degrees, the first difference is −1. If the second transition occurs at 181 degrees and the expected transition is 180 degrees, the second difference is 1. The average of the first and second transitions is 0, indicating that any calibration has been performed correctly. Otherwise, if the average is non-zero, it may indicate that the calibration has not been performed or has not been performed correctly.

Having described the preferred embodiment(s), which serve to illustrate various concepts, structures and techniques, which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims. All references cited herein are hereby incorporated herein by reference in their entirety.

The invention claimed is:

1. A method of calibrating a magnetic field sensor having first and/or second magnetic field sensing elements, the method comprising:
   setting a first input signal at a first input node of a CORDIC processor of the magnetic field sensor to a constant value;
   during the setting the first input signal, while the magnetic field sensor experiences a magnetic field, measuring a first transition at an output node of the CORDIC processor;
   setting a second input signal at a second input node of the CORDIC processor to the constant value;
   during the setting the second input signal, while the magnetic field sensor experiences the magnetic field, measuring a second transition at the output node of the CORDIC processor;
   calculating an orthogonality error value based on a deviation of the first transition and the second transition from respective expected transitions of the output signal of the CORDIC processor;
   programming the magnetic field sensor with the orthogonality error value to produce a magnetic field sensor that compensates for misalignment of the first and/or second magnetic field sensing elements; and
   adjusting the first and/or second input signal by modifying the first and/or second input signal by a function of the calculated orthogonality error value to compensate for the orthogonality error.

2. The method of claim 1 wherein the constant value is a non-zero value.

3. The method of claim 1 wherein the expected transition occurs when the magnetic field is directed to ninety degrees or one hundred eighty degrees.

4. The method of claim 1 further comprising receiving, at the second input node of the CORDIC processor, an output signal from a first magnetic field sensing element while the first input signal input is set to the constant value.

5. The method of claim 4 further comprising receiving, at the first input node of the CORDIC processor, an output signal from a second magnetic field sensing element while the second input signal input is set to the constant value.

6. The method of claim 5 wherein the first and second magnetic field sensing elements are positioned so that respective axes of maximum sensitivity of the first and second magnetic field sensing elements are substantially orthogonal to each other.

7. The method of claim 6 wherein the first and second magnetic field sensing elements are vertical Hall effect elements or magnetoresistance elements.

8. The method of claim 1 wherein the adjusting the first and/or second input signal includes providing a compensation circuit that modifies the first and/or second input signal using the function of the calculated orthogonality error value to compensate for the orthogonality error.

9. A method of calibrating a magnetic field sensor comprising:
receiving, at a first input node of a arctangent processor, a first signal from a first magnetic field sensing element;
while receiving the first signal at the first input node, receiving, at a second input node of the arctangent processor, a reference signal set to a constant value;
receiving, at the first input node of the arctangent processor, the reference signal set to the constant value;
while receiving the reference signal at the first input node, receiving, at the second input node of the arctangent processor, a second signal from a second magnetic field sensing element;
measuring a difference between a transition of an output of the arctangent processor and an expected transition of the output of the arctangent processor in response to the first, second, and reference signals;
generating an orthogonality error value based on the measured difference
programming the magnetic field sensor with the orthogonality error value to produce a magnetic field sensor with reduced orthogonality error; and
compensating for an orthogonality error of the first and/or second magnetic field sensing element by modifying an output of the first and/or second magnetic field sensing element by a function of the orthogonality error value,
wherein an axis of maximum sensitivity of the first magnetic field sensing element is substantially orthogonal to an axis of maximum sensitivity of the second magnetic field sensing element so that the first signal from the first magnetic field sensing element and the second signal from the second magnetic field sensing element are quadrature signals.

10. The method of claim 9 wherein the constant value is a non-zero value.

11. The method of claim 9 wherein the expected transition occurs when the magnetic field sensor experiences a magnetic field directed to ninety degrees or one hundred eighty degrees.

12. The method of claim 9 wherein the compensating for the orthogonality error includes providing a compensation circuit that multiplies the first and/or second input signal by the function of the measured difference to compensate for the orthogonality error.

13. The method of claim 9 wherein the first and second magnetic field sensing elements comprise vertical Hall elements or magnetoresistance elements.

14. The method of claim 9 wherein measuring the difference further comprises measuring a first angle difference between the transition of the output signal and the expected transition while the reference signal is received at the first input node, and measuring a second angle difference between the transition of the output signal and the expected transition while the reference signal is received at the second input node.

15. The method of claim 9 further comprising calculating an error value based on an average of the difference between the transition of the output of the arctangent processor and an expected transition of the output of the arctangent processor in response to the first signal and the difference between the transition of the output of the arctangent processor and an expected transition of the output of the arctangent processor in response to the second signal.

16. A magnetic field sensor comprising:
a first magnetic field sensing element for generating a first input signal and having a first axis of maximum sensitivity;
a second magnetic field sensing element for generating a second input signal and having a second axis of maximum sensitivity;
a arctangent processor coupled to receive the first input signal and the second input signal, and configured to generate an output signal representing a detected angle of a magnetic field; and
a compensation circuit coupled to receive the first or second input signal from the first or second magnetic field sensing element and configured to modify the first or second input signal using a compensation signal, the compensation signal representing an orthogonality error value programmed in the magnetic field sensor and derived by:
setting the first input signal to a constant value and measuring a first difference between a first transition of the output signal of the arctangent processor and a first expected transition of the output signal of the arctangent processor; and
setting the second input signal to the constant value and measuring a second difference between a second transition of the output of the arctangent processor and a second expected output signal of the arctangent processor.

17. The magnetic field sensor of claim 16 wherein the first and second output signals represent a detected magnetic field.

18. The magnetic field sensor of claim 16 wherein the first and second axes of maximum sensitivity are substantially orthogonal to each other.

19. The magnetic field sensor of claim 16 wherein the first output signal and the second output signal comprise quadrature signals.

20. The magnetic field sensor of claim 16 wherein the first and second magnetic field sensing elements comprise vertical Hall effect elements or magnetoresistance elements.

21. The magnetic field sensor of claim 16 wherein the error value is further derived by summing the first and second differences between the first and second transitions of the output signal of the arctangent processor and the expected transition.

22. The magnetic field sensor of claim 16 wherein the first expected transition of the output signal of the arctangent processor is indicative of ninety degrees and the second expected transition of the output signal of the arctangent processor is indicative of one hundred eighty degrees.

* * * * *

UNITED STATES PATENT AND TRADEMARK OFFICE
CERTIFICATE OF CORRECTION

PATENT NO. : 10,288,698 B2  
APPLICATION NO. : 15/180199  
DATED : May 14, 2019  
INVENTOR(S) : Hernan D. Romero Page 1 of 1

It is certified that error appears in the above-identified patent and that said Letters Patent is hereby corrected as shown below:

On the Title Page

Item (57), Line 8, delete "of at" and replace with --at--.

In the Specification

Column 1, Line 42, delete "of at" and replace with --at--.

Column 5, Line 35, delete "TO" and replace with --T0--.

Column 5, Line 38, delete "Ti" and replace with --T1--.

Column 5, Line 50, delete "my" and replace with --by--.

Signed and Sealed this
Eighteenth Day of February, 2020

Andrei Iancu
*Director of the United States Patent and Trademark Office*